United States Patent
Partee (10) Patent No.: US 8,996,806 B2
(45) Date of Patent: *Mar. 31, 2015

(54) SYSTEM AND METHOD FOR AUDITING MEMORY CARDS

(71) Applicant: ATC & Logistics & Electronics, Inc., Fort Worth, TX (US)

(72) Inventor: Jimmie Paul Partee, Double Oak, TX (US)

(73) Assignee: ATC Logistics & Electronics, Inc., Fort Worth, TX (US)

( * ) Notice: Subject to any disclaimer, the term of this patent is extended or adjusted under 35 U.S.C. 154(b) by 257 days.

This patent is subject to a terminal disclaimer.

(21) Appl. No.: 13/664,891

(22) Filed: Oct. 31, 2012

(65) Prior Publication Data

US 2013/0205178 A1    Aug. 8, 2013

Related U.S. Application Data

(63) Continuation-in-part of application No. 13/366,967, filed on Feb. 6, 2012, now Pat. No. 8,799,575.

(51) Int. Cl.
| G06F 12/00 | (2006.01) |
| G11C 29/08 | (2006.01) |
| G11C 29/56 | (2006.01) |

(52) U.S. Cl.
CPC .......... *G11C 29/08* (2013.01); *G11C 29/56016* (2013.01)
USPC ........................... 711/115; 711/156; 711/163

(58) Field of Classification Search
USPC .................................. 711/115, 154, 156, 163
See application file for complete search history.

(56) References Cited

U.S. PATENT DOCUMENTS 5,564,033 A * 10/1996 Takekuma et al. ............ 711/115
2004/0059925 A1   3/2004 Benhammou et al.

* cited by examiner

*Primary Examiner* — John Lane
(74) *Attorney, Agent, or Firm* — McGuireWoods LLP (57) ABSTRACT

A system and method for auditing memory cards. A memory card is received in a card reader in communication with a computing device. The memory card is scanned utilizing a computing device. A determination is made whether content in the memory card is acceptable or unacceptable. A first volume name of the memory card is rewritten to the second volume name in response to determining the content in the memory card is acceptable.

21 Claims, 10 Drawing Sheets

SYSTEM AND METHOD FOR AUDITING MEMORY CARDS

CROSS-REFERENCE TO RELATED APPLICATIONS

This application is a continuation-in-part of U.S. patent application Ser. No. 13/366,967 entitled "MEMORY CARD CLEANER AND METHOD OF UTILIZATION" filed Feb. 6, 2012 and is related to U.S. patent application Ser. No. 12/940,331 filed Nov. 5, 2010 entitled "SYSTEM AND METHOD FOR REMOVING CUSTOMER PERSONAL INFORMATION FROM AN ELECTRONIC DEVICE", which is a co-pending application of U.S. patent application Ser. No. 12/940,411 entitled "SYSTEM AND METHOD FOR FLASHING A WIRELESS DEVICE" filed on Nov. 5, 2010; Ser. No. 12/940,346 entitled "SYSTEM AND METHOD FOR AUDITING REMOVAL OF CUSTOMER PERSONAL INFORMATION ON ELECTRONIC DEVICES" filed on Nov. 5, 2010; and Ser. No. 12/940,299, entitled "SYSTEM AND METHOD FOR TRACKING CUSTOMER PERSONAL INFORMATION IN A WAREHOUSE MANAGEMENT SYSTEM" filed on Nov. 5, 2010. The teachings and disclosures of which are each hereby incorporated in their entireties by reference thereto.

BACKGROUND

The use of and development of electronic devices has grown nearly exponentially in recent years. The growth is fueled by reduced processor, circuit, and logics sizes, larger networks, more reliable protocols, enhanced software functionality, and better hardware available to manufacturers, service providers, and consumers. As a result, more people than ever are buying and using electronic devices. Correspondingly, the number of memory cards, memory devices, memory drives, and external memory units (hereinafter referred to as "memory cards") utilized by these electronic devices has sky rocketed as have the logistical problems of processing memory cards that are returned for refunds, exchanges, repairs, or refurbishments.

Under various circumstances, users may return memory cards to an original equipment manufacturer (OEM), retailer, repair facility, service provider, logistics provider, or other entity. Memory cards are often returned for exchanges, warranty issues, or any number of other justified or arbitrary reasons. It is imperative that any memory card that has been returned be cleared of all personal information, sensitive data, or other information linked to a previous user. If the personal information is not removed, applicable laws, industry standards, and common business practices may be violated. For example, the personal information may be used by another party to perpetrate an act of identity theft. Similarly, the privacy of a previous user may be otherwise violated.

SUMMARY

One embodiment provides a system and method for auditing memory cards. A memory card may be received in a card reader in communication with a computing device. The memory card may be scanned utilizing a computing device. A determination may be made whether content in the memory card is acceptable or unacceptable. A first volume name of the memory card may be rewritten to the second volume name in response to determining the content in the memory card is acceptable.

Another embodiment includes a system for auditing one or more memory cards. The system may include a computing device configured to display instructions for auditing the one or more memory and electronic records for each of the one or more memory cards. The system may also include a card reader in communication with the computing device. The card reader may be configured to receive one or more memory cards. The computing device may be configured to automatically scan the one or more memory cards utilizing the card reader, determine whether content on the one or more memory cards is acceptable or unacceptable, and rewrite a volume name from a first volume name of the one or more memory cards to a second volume name in response to determining the content on the one or more memory cards is acceptable.

Yet another embodiment includes a computing device for verifying content of one or more memory cards. The computing device may include a processor for executing a set of instructions, a memory for executing the set of instructions, and a card reader for communicating the one or more memory cards. The set of instructions may be executed to scan the one or memory cards utilizing a computing device determine whether content on the one or more memory cards is acceptable, and rewriting a first volume name to a second volume name in response to determining the content in the one or more memory cards is acceptable.

BRIEF DESCRIPTION OF THE DRAWINGS

Illustrative embodiments of the present invention are described in detail below with reference to the attached drawing figures, which are incorporated by reference herein and wherein.

DETAILED DESCRIPTION OF THE DRAWINGS

The illustrative embodiments provide a system method and device for clearing and auditing memory cards. Memory cards are portable memory devices. For example memory cards may include secure digital (SD) non-volatile memory cards (SD, SDHC, miniSD, and microSD), multi media cards (MMC), USB drives, adapters for other memory cards (e.g. USB memory card adapters), flash memories, and other portable memory storage elements or devices. Memory cards may be utilized in personal computers, wireless communications devices, PDAs, digital audio players, digital cameras, synthesizers, video games, scientific instrumentation, industrial robotics, medical electronics, gaming systems and so forth. In one embodiment, the system, method and devices herein described may be utilized to verify removal of consumer protected information (CPI), or synonymously, customer personal information.

As a result memory cards may be returned, resold, or otherwise distributed knowing that the CPI has been removed. Removal of the CPI may be documented for additional reference and for subsequent audits. The memory card may be cleared, verified as cleared, and documented utilizing one or more clearing and establishing processes, systems, and devices which may include generating, managing, and detecting a volume name of the memory card, a master image, and an identifier stored in the memory card. In one embodiment, an identifier may be associated with each memory card individually and stored in a hidden file so as not to bother a future user.

Volume names may also be assigned to each memory card to identify a facility or process currently or previously implemented for each of the memory cards. For example, different volume names may be associated with different facilities or different processing steps. Records for each of the memory cards may be stored in a network based system, such as a database accessible through a server, to access, manage, and update the records.

As a result, manufacturers, OEMs, service providers, logistics providers, retail locations, and others may be able to document processing of the memory card including removal of the CPI to comply with industry standards, applicable laws, or best practices in the industry. For example, if CPI is detected on a memory card that has been processed. One or more parties may verify that the memory card was previously processed with all applicable CPI being removed. Subsequent storage of CPI to the memory cards or tampering with the memory card may also be detected providing additional quality assurances and liability protection to the parties involved in the manufacturing, processing, and distribution of memory cards. The processes and systems of the illustrative embodiments may also be applied to other smart or dumb devices or components for clearing CPI and preparing the devices or components for subsequent processing.

Figure 1:
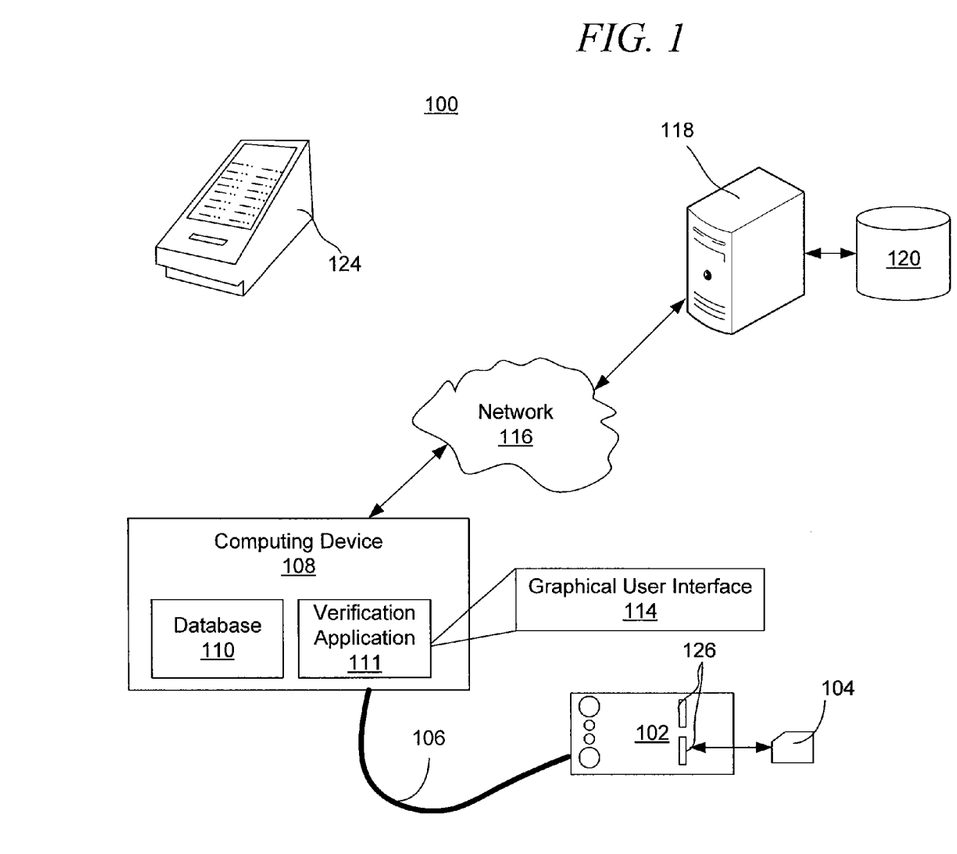
FIG. 1 is a pictorial representation of a memory card clearing system in accordance with an illustrative embodiment.

FIG. 1 is a pictorial representation of a memory card clearing system 100 in accordance with an illustrative embodiment. The memory card clearing system 100 may include any number of components. In one embodiment, the memory card clearing system 100 includes a card reader 102, a memory card 104, a cable 106, a computing device 108, a database 110, a verification application 111, a graphical user interface 114, a network 116, a server 118, and a database 120. A clearing station 124 may also be utilized as part of the memory card clearing system 100 or independently.

In one embodiment, the CPI of multiple memory cards is cleared or overwritten utilizing the clearing station 124. The clearing station 124 may be configured to erase or overwrite multiple memory cards simultaneously. Alternatively, the clearing station 124 may be configured to erase one memory card at a time, such as the memory card 104. For example, the memory card 104 may be a USB memory card or a USB adapter for receiving a mini or micro SD card. In one embodiment, the clearing station 124 is a NeXcopy USB131A USB SD duplicator with a created Department of Defense (DOD) DOD 5220.22-M (or the most recent industry or DOD standard) compliant master image consisting of 3× overwrite and individual cell verification of the memory card 104 with a value of zero. After the applicable wipe standard (e.g. DOD standard) is applied, then the clearing station 124 formats the memory card 104 with the current file allocation table (FAT) and master boot record (MBR) representing the same file structure as provided on new OEM memory cards. A volume name later to be used in the validation process is also written to the memory card 104. The master image may be encased in a sealed container indicating memory size date and initials of creator on a tamper proof label as not to allow opening of the master image without detection. The USB131A is capable of duplicating the master image in batches of up to 31 memory cards. Other clearing stations may process more or less memory cards simultaneously, serially, or in parallel.

In one embodiment, the clearing station 124 may include a first slot (slot 1) that is "read only" that is defined and utilized as a master slot. The master slot may be configured to receive a sealed tamper proof master image. The additional read/write slots (2-32) are utilized to copy the master image from slot 1 bit by bit to the remaining 30 available slots that are connected to memory cars similar to that inserted in the master slot. In one embodiment, the clearing process may only be performed for cards that are identical to the master card.

In one embodiment, the master image may include a file allocation table (FAT)32 (File Allocation Table), master boot record MBR, and a volume name of "Imaging" which may be used for validation purposes during the final quality phase. For example, should a different size than the master be inserted, the clearing station 124 may fail that slot and the corresponding memory card by identifying the slot with a red light emitting diode (LED) status light along with a liquid crystal display (LCD) identifying a size mismatch. Any memory card and corresponding slot which is unable to be verified as 100% bit for bit duplication of the master image may also display a red light status failure indicating a write or read failure within the LCD display. In one embodiment, a duplication failure on the clearing station 124 may result in the rejected memory card being removed and segregated from the other memory cards for destruction, analysis, or additional processing.

Once the memory cards are processed utilizing the clearing station 124, the memory cards are validated or tested one by one utilizing the card reader 102. For example where the memory card 104 is a USB adapter, the USB adapter may be inserted into the card reader 102 by an operator. In another embodiment, the card reader 102 may be configured to receive numerous memory cards for sequential, concurrent, or simultaneous testing. In one embodiment, the card reader 102 includes one or more port 126 for receiving the memory card 104. The ports 126 may be configured to receive any type of memory card as defined herein. In other embodiments, the card reader 102 may include multiple components for simultaneous testing.

The memory card verification process may begin with the operator turning on the computing device 108 or opening the verification application 111. The verification application 111 is a program, application, or routine configured to interface with the card reader 102. In one embodiment, the verification application 111 provides instructions for the operator to test the memory card 104 through the graphical user interface 114. In one embodiment, the verification application 111 may display a home screen for performing testing once the card reader 1202 is reset or detected by the computing device 108. The verification application 114 may also display counters for testing memory cards and a total pass count for memory cards tested utilizing the computing device 108 and the card reader one or two. In one embodiment, the counters may be resettable or non resettable. For example, a temporary counter for devices tested within a time period may be resettable and the total pass counter may not be resettable. In one embodiment, the card reader 102 is automatically reset in response to receiving the memory card 104. In another embodiment, the card reader 102 includes a reset button for resetting the card reader 102 to perform another test.

The verification application 111 is executed by the computing device 108 to perform connectivity tests for the card reader 102 and the cable 106. The card reader 102 may include indicators, such as light emitting diodes (LEDs) that indicate errors experienced by the memory card clearing system 100. For example, the indicators may flash or light up indicating to the operator whether the cable 106 or card reader 102 have failed the connectivity test. In another embodiment, the card reader 102 may also include a display, touch screen, or other interface components known in the art.

The verification application 111 may also be configured to display the status of each component of the memory card clearing system 100 by displaying an icon, flashing screen, or other graphical indicator and/or playing an associated sound. For example, one of the LED indicators may flash yellow indicating that either the card reader 102 is suffering errors or the memory card 104 cannot be read. The operator may attempt to reset the card reader 102 by pressing a reset button to determine whether a reset operation clears the applicable errors or failures. In another embodiment, the verification application 111 may display testing instructions and results for numerous memory cards on a displaying (not shown) of the computing device 108.

Next, the verification application 111 may scan the memory card 104 to determine whether the memory card 104 may be categorized as valid, previously processed, or failed. The verification application 111 may search or scan for a designated volume name that indicates clearing was previously performed. The valid volume name may be the "Imaging" name previously written to the memory card 104 by the clearing station 124 during the duplication and clearing process. If the associated volume name, such as "Imaging" is found, the memory card has passed the test.

If a hidden file or other file is detected on the memory card 104, a cyclic redundancy check may be performed to determine whether a specified hidden file of a defined length is present. If both tests for the volume name and hidden file are passed, the verification application 111 continues with validation, clearing, and cleaning. Values stored within the hidden file are compared against predetermined values to determine whether the memory card 104 was previously cleaned. If a hidden file or other file is detected, a full red screen is displayed by the graphical user interface 114 of the computing device 108 and the verification application 111 may be locked. In response to detecting any testing failures, the memory card 104 is removed and destroyed utilizing approved methods, such as DOD methods and processes for physical destruction. In one embodiment, a default red screen may be displayed by the graphical user interface 114 and a supervisory password may be required to unlock or reset the verification application 111.

In one embodiment, the verification application 111 may be locked until a detailed fail status report including a station identification for the computing device 108 and/or card reader 102, a serial number of the memory card, and a time/date stamp is recorded indicating why the test has failed. The status report may be written to the database 110 as well as the server 118. The server 118 may also write the status report to the database 120. In one embodiment, the generation of a status report indicating the failure of the memory card 104 may result in the status report being automatically emailed to one or more supervisors, managers, or quality control departments to investigate how the failure occurred. For example, a quality control operator may investigate the reason for the failure and issue a corrective action preventive action.

If the memory card 104 includes a volume name that is not approved, the verification application 111 may be locked and the graphical user interface 114 may display the red screen until a correct reset password is entered. In addition, a status report indicating the inconsistency of the volume name may be recorded and reported. In one embodiment, an inconsistent volume name results in a corrective action preventive action being initiated by a manager, supervisor, or quality control specialist.

The verification application 111 is further configured to scan for any files within the readable memory size area of the memory card 104. The verification application 111 scans for files including visible, hidden, locked, or unlocked files. If the verification application 111 does not detect any files, the memory card 104 has passed the test and may continue to be processed.

If the verification application 111 detects any folders or files in the memory card 104, the memory card 104 fails the test. If a folder is detected, the memory card 104 still includes CPI or the memory card 104 was previously processed and a hidden file was stored on the memory card. In either case, the memory card 104 fails the test. Once a file or folder is detected, the verification application 111 displays a red screen indicating folders are detected and locks the verification application 111 until the reset password is received. A detailed fail status report including a system or station identification for the card reader 102 and computing device 108, memory card serial number, time/date stamp, and details regarding the failed test may be saved to the computing device 108, the server 118, and the associated databases 110 and 120.

Once, the memory card 104 has passed all of the applicable tests, a hidden file is written to the memory card 104 and a serial number unique to the memory card clearing system 100 is generated. The serial number is saved within or to the hidden file. The volume name is also changed to a second designated volume name, such as "Pass" indicating that the memory card 104 has passed all applicable tests.

A pass file is written to the computing device 108 and/or server 118 and associated databases 110 and 120. The pass file may include the volume name, the serial number stored in the hidden file, the size of the memory card 104, the volume name, a time/date stamp, a name of the computing device 108 that was utilized to process the memory card 104, and other relevant information.

If the processing, of the memory card 104 needs to be verified, the pass file or a failure report may be consulted. For example, if a logistics processing company receives a report of a memory card that was sent to a customer with CPI, the logistics processing company may (1) verify that the volume name of the memory card is "Pass", and (2) ensure that the memory card includes a hidden file containing the serial number and a date/time stamp which coincides with server records. If, for example, the memory card is formatted and includes CPI, the memory card should include a different virtual serial number indicating tampering with the memory card.

In one embodiment the computing device 108 may include a processor and a memory (not shown). The processor may be a digital processing unit. The processor may also be any processing device suitable for executing applications, manipulating data, and processing instructions and communications signals. For example, the processor may be a computer processor or wireless device processor. In one embodiment, the processor may be configured to execute a program to remove CPI from me applicable memory card(s). The memory may be a memory device for storing data, for example, a hard drive, or random access memory for storing information or data. However, the memory may be any dynamic, static, volatile, or non-volatile memory type or configuration suitable for storing and accessing electronic information and data. In another embodiment, the card reader 102 may include all of the components, features, and functionality of both the computing device 108 and the card reader 102.

In one embodiment, the computing device 108 and the server 118 may be accessible by any number of other computing or communications devices through the network 116. For example, utilizing a web interface to the network 116, server, or computing device 108, such as a web browser, a user may access electronic records associated with a number of memory cards. The electronic records may be utilized to verify the volume name save to the memory card 104, the serial number stored in the hidden file on the memory card 104, or other data or information associated with the memory card 104 or the processing of the memory card 104. In one embodiment, permissions or authorizations may specify the parties that are enabled to access the server 118 or database 120 (i.e. username and password). The electronic record save for each memory card provides an audit trail for the clearing and verification processes herein described.

Although not shown, the clearing station 124 may be similarly connected to the network 116 for saving results of the clearing operation or process to the server 118 or computing device 108. In another embodiment, the card reader 102 may include the components and perform the functionality of the card clearing station 124.

In another embodiment, the memory card clearing system 100 may include a scanner (not shown) for scanning a bar code or other external identifier of the memory card 104. The external identifier may also be stored in the electronic record associated with the memory card 104 for subsequent reference.

Figure 2:
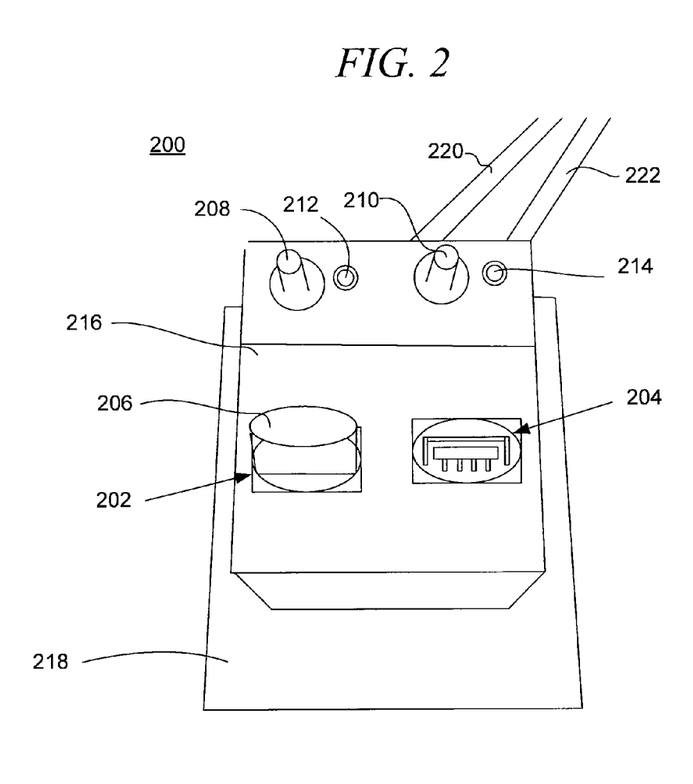
FIG. 2 is a pictorial representation of a card reader in accordance with an illustrative embodiment.

FIG. 2 is a pictorial representation of a card reader 200 in accordance with an illustrative embodiment. The card reader 200 may be configured in any number of ways. In one embodiment, the card reader 200 includes slots 202 and 204, a memory card 206, buttons 208 and 210, indicators 212 and 214, a base 216, a plate 218, and cables 220 and 222. In one embodiment, the card reader 200 may be configured to provide a redundant backup. For example, the slot 204, button 210, and cable 222 may only need to be used if the slot 202, button 208, or cable 220 of the card reader 200 fail.

In one embodiment, the card reader 200 is an adapter configured to connect to or communicate with a computing or communications device. The card reader 200 may be utilized to verify and validate that the CPI was properly removed and that the memory card 206 is properly formatted and prepared for additional processing. As a result, the card reader 200 acts as a quality control station that may be utilized by an operator or user.

The card reader 200 may include interchangeable components for replacing the various electronic components as they wear out from repeated use. In one embodiment, the card reader 200 may include adapter modules (not shown) configured to interface with any number of memory card types. The adapter modules may be received by the base 216 and may include the slots 202 and 204. The adapter modules are interchangeable and may be selected for the applicable type of memory card being tested. For example, in the card reader 200, the adapter modules may include slots 202 and 204 configured to receive USB memory cards. In another embodiment, the modules may be configured to receive mini and micro SD cards or other types of memory cards.

The slots 202 and 204 are electrical interfaces for connecting to and communicating with memory cards, such as the memory card 206. Alternatively, the slots 202 and 204 may be referred to as ports, or interfaces into which the applicable memory cards are inserted. The slots 202 and 204 are sized and shaped to receive the memory card 206. In addition, the slots 202 and 204 include pins, connectors, and other electrical components for interfacing with the memory card 206.

In one embodiment, the buttons 208 and 210 are electrical switches that disconnect the card reader 200 from power. The buttons 208 and 210 may be particularly useful for resetting the card reader 200 when the card reader 200 is connected to a Windows-based computing device. For example, cutting power to the card reader 200 may be the most efficient method of resetting the card reader 200. For example, selecting the buttons 208 and 210 may remove power from the card reader 200 and releasing the buttons 208 and 210 may allow drivers, operating systems, or applications to detect the card reader 200. The buttons 208 and 210 a method of using them may prevent false connectivity issues which could produce an error, caution, or connectivity issues (e.g. windows OS) that may lead to improper failures, troubleshooting, or destruction of the card reader 200 resulting in additional costs. Alternatively, the buttons 208 and 210 may utilize or generate any number of other command signals sending the card reader.

The indicators 212 and 214 may indicate whether the card reader 200 is functioning correctly. For example, the indicators 212 and 214 may be LEDs that glow or flash green when the card reader 200 is functioning properly. The indicators 212 and 214 may flash a yellow signal when the card reader 200 or corresponding electrical components of the card reader 200 are experiencing errors. In addition, the indicators 212 and 214 may flash a red signal when the card reader 200 is nonfunctional. The card reader 200 may include any number of other displays or indicators that are not shown. For example, the card reader 200 may include an additional indicator that informs the operator that the computing device to which the cables 220 and 222 are connected is functioning properly. In another embodiment, the card reader 200 may include a graphical user interface for making selections for displaying information, such as "Pass", "Fail", or "Testing Incomplete Due to Errors."

In one embodiment, the cables 220 and 222 may be configured to connect to any number of ports or adapters at the card reader 200 and the computing device. For example, the cables 220 and 222 may connect to USB ports of the computing device. The cables 220 and 222 may be physically integrated with the card reader 200 or may connect to USB ports of the card reader 200. The cables 220 and 222 may also be configured to connect to FireWire, serial, or parallel ports of the computing device. In addition, the cables 220 and 222 may be configured to connect to any type of standard or proprietary input/output interfaces of the computing device.

In one embodiment, the base 216 may house electrical components, such as buses, voltmeters, ammeters, digital logic, controllers, processors, memories, queues, counters, ASICs, or other similar electrical components for interfacing with the slots 202 and 204 and communicating with a computing device through the cables 220 and 222.

The plate 218 is attached to the base 216. The plate 218 may be configured to support and stabilize the card reader 200 while being used by the operator. For example, the plate 218 stabilizes the card reader 200 when the memory card 206 is inserted or removed from the slot 202 or when the buttons 208 and 210 are engaged by the operator. The plate 218 may be attached or secured to a table, desk, test stand, or other component for additional stability utilizing screws, glue, tape, suction cups, clamps, vices, or so forth.

Figure 3:
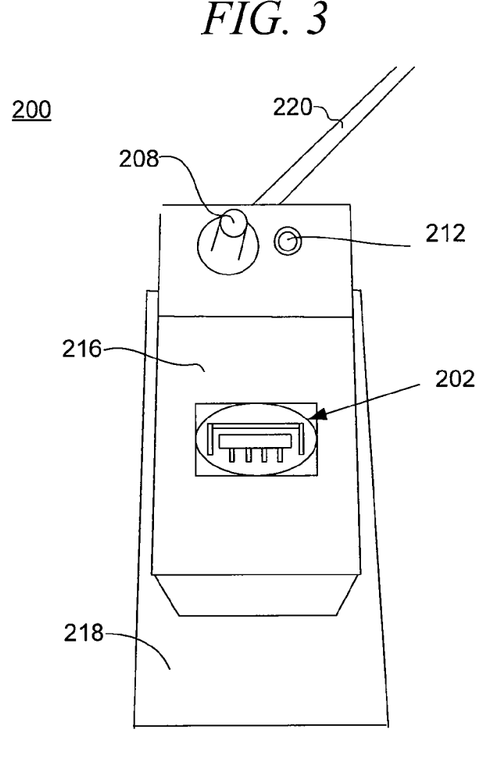
FIG. 3 is a pictorial representation of a card reader in accordance with another illustrative embodiment.

FIG. 3 is a pictorial representation of a card reader 300 in accordance with an illustrative embodiment. The card reader 300 is similar to the card reader 200 of FIG. 2 without the redundancy of the additional electrical components. The card reader 300 may be utilized to test a single memory card at a time.

Figure 4:
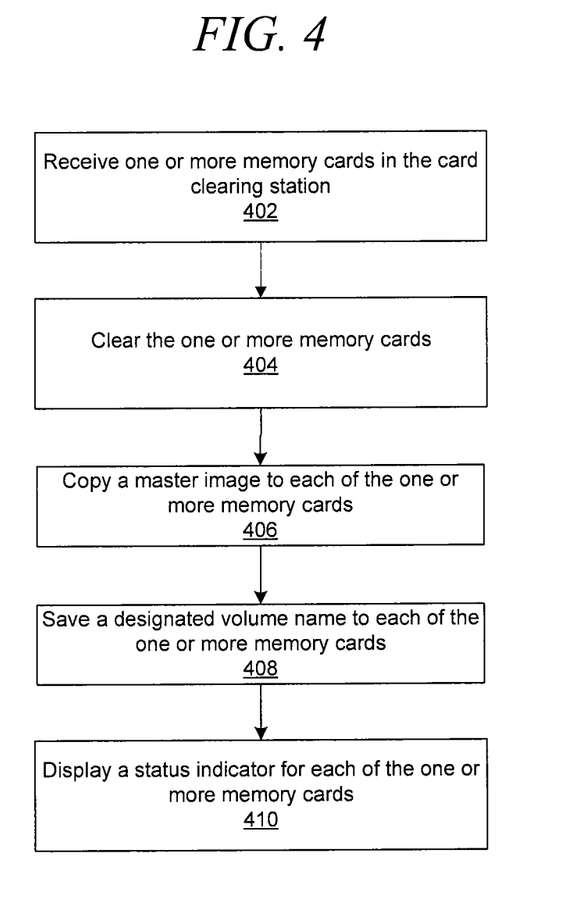
FIG. 4 is a flowchart of a process for clearing a memory card in accordance with an illustrative embodiment.

FIG. 4 is a flowchart of a process for clearing a memory card in accordance with an illustrative embodiment. The process of FIG. 4 may be implemented by a card clearing station, system, or device.

In one embodiment, the process of FIG. 4 may begin with the card clearing station receiving one or more memory cards (step 402). In one embodiment, the card clearing station may be configured to receive numerous memory cards for simultaneous clearing, testing, and rewriting. For example, the card clearing station may include a master slot configured to receive a master card from which the master image is copied or duplicated to the other memory cards and thirty other slots for receiving the memory cards.

Next, the card clearing station clears the one or more memory cards (step 404). Clearing the one or more memory cards may include cell by cell, or bit by bit deletion or overwriting to clear any potential CPI. The process may comply with applicable industry standards or military standards, such as DOD 5220.22-M.

Next, the card clearing station copies a master image to each of the one or more memory cards (step 406). The master image may be copied from the master card bit by bit to each of the one or more memory cards. Duplication of the master image may only be performed if each of the one or more memory cards corresponds in size to the master card.

Next, the card clearing station saves a designated volume name to each of the one or more memory cards (step 408). The designated volume name may be set by a logistics company, business, or operator and may be utilized to ensure that each of the one or more memory cards has been processed by the card clearing station. For example, the designated volume name may be "Imaging" and each of the one or more memory cards may include that same volume name.

Next, the card clearing station displays a status indicator for each of the one or more memory cards (step 410). The card clearing station may include one or more indicators for each of the slots utilized for clearing the memory cards. For example, the card claim station may include three LEDs to display a green, red, or yellow indicator associated with a pass result, a failure, or an error. In one embodiment, the card clearing station may display a red LED status indicator in response to one of the memory cards failing any part of the process of FIG. 4.

Figure 5:
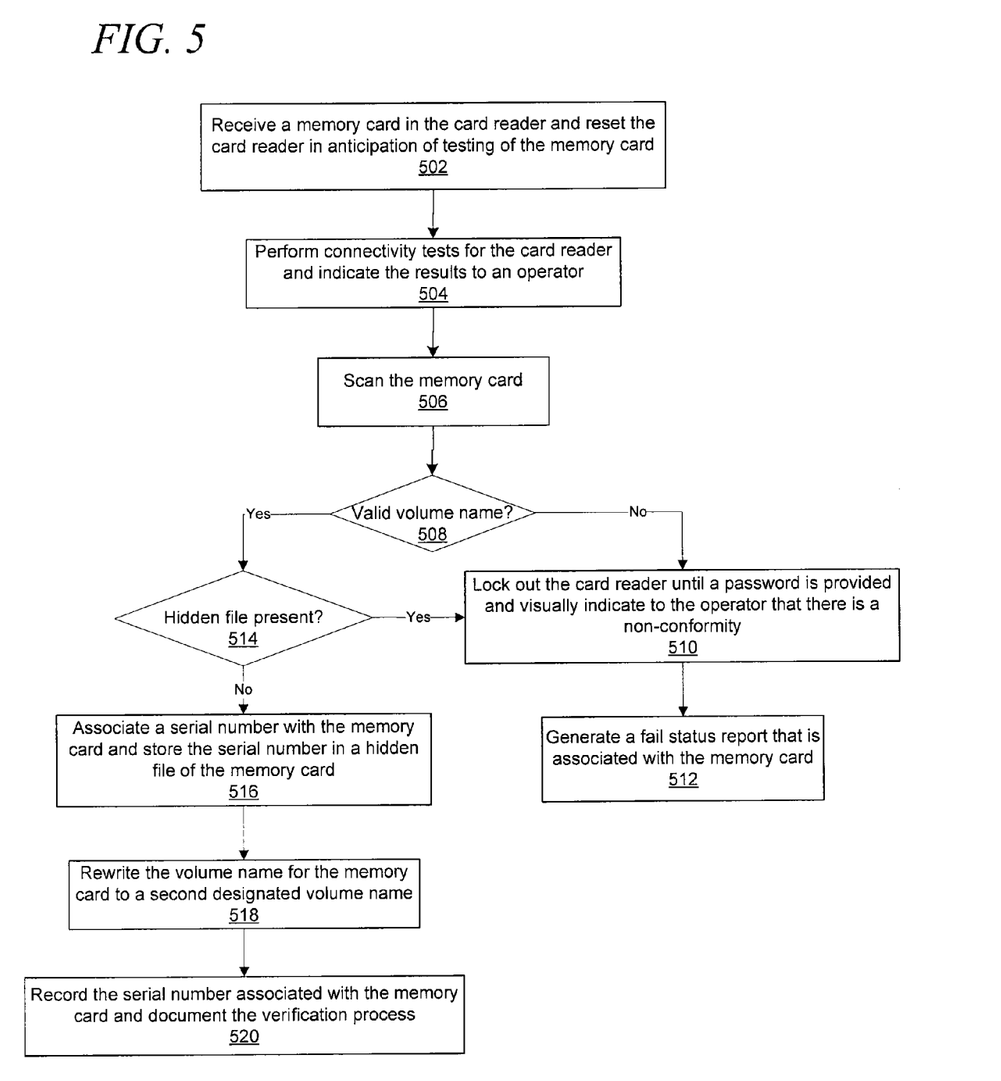
FIG. 5 is a flowchart of a processing for verifying that a memory card has been cleared in accordance with an illustrative embodiment.

FIG. 5 is a flowchart of a processing for verifying that a memory card has been cleared in accordance with an illustrative embodiment. The process of FIGS. 5, 12, and 13 may be implemented by a system including a card reader in communication with a computing device.

In one embodiment, the process may begin with the system receiving a memory card in the card reader and resetting the card reader in anticipation of testing the memory card (step 502). In one embodiment, the card reader may be reset automatically in response to the memory card being inserted into the card reader. In another embodiment, the card reader may be reset in response to a selection by the operator. For example, a reset button on the card reader may be selected disconnecting power from the card reader and allowing the computing device to detect the card reader.

Next, the system performs connectivity tests and indicates the results to an operator (step 504). The connectivity tests ensure that the card reader and computing device are communicating properly. In one embodiment, the connectivity tests may provide details indicating whether the card reader is functional, the connection between the card reader and the computing system is operating properly, and whether the computing device and a verification application are functioning properly to perform the verification process. For example, the computing device may execute a verification application that interfaces with the card reader to perform the process of FIG. 5. The verification application may include a graphical user interface that displays data and information to the operator. In addition, the verification application may be utilized to provide instructions and receive feedback from the operator. For example, the verification application may indicate to the operator that the connectivity tests were successful and that testing of the memory card may proceed.

Next, the system scans the memory card (step 506). In one embodiment, the card reader may scan the memory card, bit by bit to determine the volume name, stored files or folders, and what, if any, data is stored on the memory card. The scanning process of step 506 may include a read operation of each and every bit of the memory card.

Next, the system determines whether there is a valid volume name (step 508). The volume name may have been previously saved to the memory card by the card clearing station. For example, if the volume name of the memory card is not "Pass", the volume name is determined to be invalid.

If there is not a valid volume name, the card reader is locked out until a password is provided and visually indicates to the operator that there is a non-conformity (step 510). In one embodiment, the password may be required to be received from an administrator or supervisor rather than just the operator. For example, requiring the password made sure that the failure is correctly identified and steps are made to remedy the problem as needed. Alternatively, the operator may provide the password. The password may be received by the computing device communicating with the card reader. For example, the password may be received through a keyboard, mouse, touch screen, or other input/output interface of the computing device.

The verification application may visually indicate that there is a non-conformity. In one embodiment, if there is not a valid volume name, as determined in step 508, the memory card was not previously processed or was not processed correctly. As a result, the graphical user interface of the verification application may display a red screen indicating "Incorrect Volume Name."

Next, the system generates a fail status report that is associated with the memory card (step 512). In one embodiment, the fail status report is saved to a secure server in communication with the computing device. For example, the fail status report may indicate the volume name saved to the memory card. In addition, the fail status report may include the system or station identification, a serial number associated with the memory card, a time/date stamp, and the portion of the test or process that the memory card has failed. After step 512, the memory card may require additional processing or reprocessing to remove CPI or determine why the volume name was invalid. An automated or manual quality control process or investigation may utilize the fail status report to determine the reason for the failure. Any number of corrective actions may be made to the card clearing station, the system or strike that, or the processes as herein described.

If the volume name is determined to be valid in step 508, the system determines whether a hidden file is present (step 514). The determination of step 514 may be based on the memory card scan that is performed during step 506. The presence of a hidden file indicates that the memory card has not been processed correctly as there should be no hidden files on the memory card at this point. If there is a hidden file present, the system locks out the card reader until a password is provided and visually indicates to the operator that there is a nonconformity (step 510). For example, the system may display a red screen indicating "Hidden File Detected" so that the memory card may be further processed. Likewise, the system generates a fail status report but is associated with the memory card (step 512).

If a hidden file is not present during step 514, the system associate a serial number with the memory card and stores the serial number in a hidden file of the memory card (step 516). The serial number is a unique identifier that is utilized to identify the memory card. In one embodiment, the serial number is associated with the verification system including the card reader and computing device. As a result, subsequent review of the serial number may indicate not only was CPI removed and verified, but also the system utilized to perform the verification.

Next, the system rewrites the volume name for the memory card to a second designated volume name (step 518). In one embodiment, the volume name may be "Pass." Alternatively, the volume name may be any designator specific to the system, operator, business, or other party verifying the content of the memory card.

Next, the system records the serial number associated with the memory card and documents the verification process (step 520). The serial number may be written to the secure server. A record may be kept for each memory card that is cleared and verified. In one embodiment, the serial number is unique to this system for tracking the memory cards that have been processed for quality assurance and security purposes. The record include information such as the memory card type, make, or model, card size, time and date of cleaning and verification, system name including card reader and computing device, and serial number. In one embodiment, the record is an XML file stored to a database that is accessible through a web interface.

The process of FIG. 5 may be utilized to ensure that CPI is not distributed to other parties. When the memory card is sold, resold, utilized, distributed, or otherwise processed. For example, if a claim is made that the memory card include CPI, the relevant party may determine (1) whether the volume name is pass; and (2) whether the hidden file contains a serial number and date of creation, which coincides with the record on the secure server. If the memory card is formatted and CPI written or another virtual serial number is assigned, the party may determine that the memory card has beat has been tampered with. In addition, if CPI is written to the memory card after a successful clearing and verification process, the timestamp of the written information will be after the timestamp of the verification record indicating subsequent use and that the party is not responsible for the CPI on the memory card.

Figure 6:
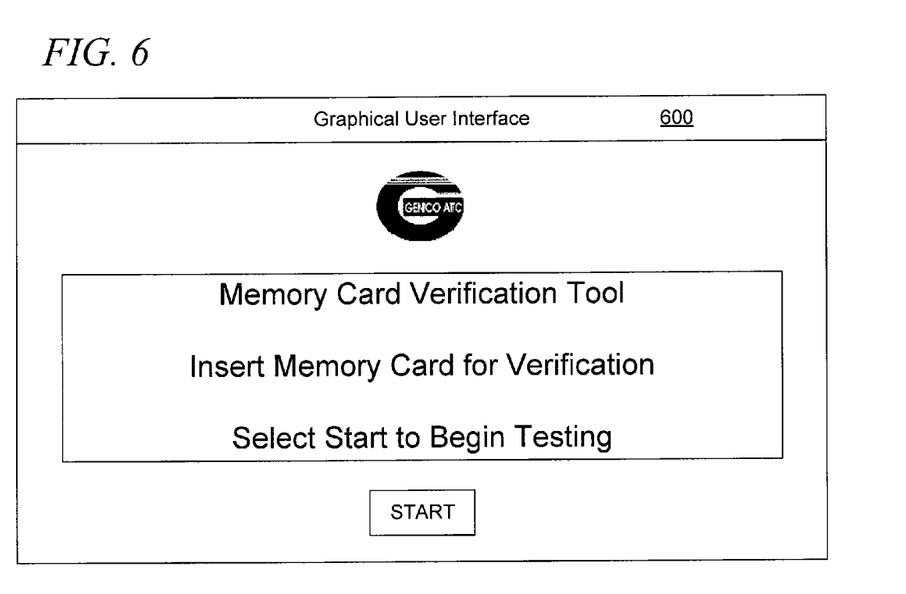
FIGS. 6-11 are pictorial representations of a graphical user interface for a verification application in accordance with an illustrative embodiment.

FIGS. 6-10 are pictorial representations of a graphical user interface (GUI) for a verification application in accordance with an illustrative embodiment. The verification application may display a number of screens or windows that provide instructions and receive feedback from the operator of the card reader and computing device. The various screens of the GUI may include any number of windows, text fields, icons, or other selection elements. In one embodiment, the verification application may walk the operator through each step of the verification process. With reference to FIG. 6, a GUI 600 may instruct the operator to insert a memory card for verification after which, the user may press the start button or indicator to begin.

Figure 7:
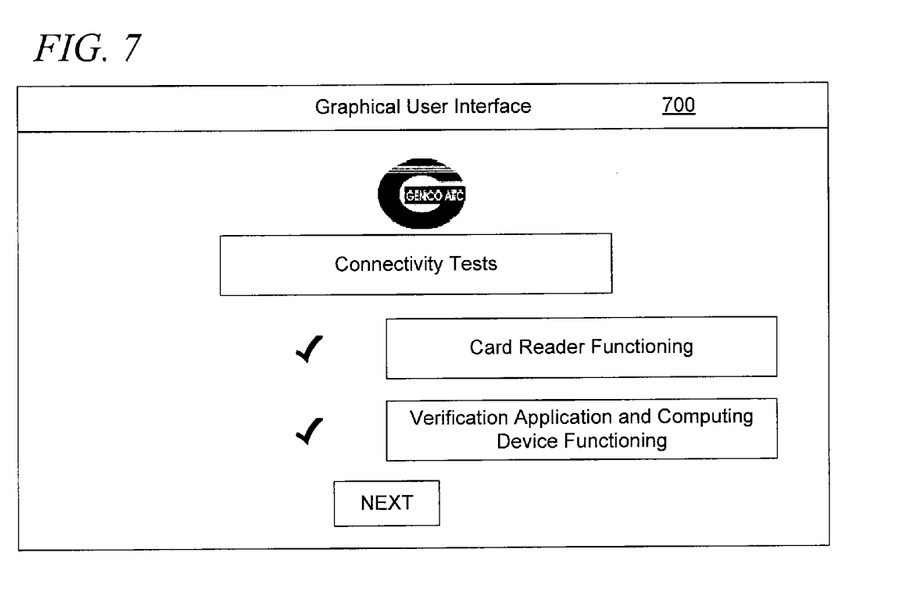

With reference to FIG. 7, the GUI 700 may display the results of a connectivity test. In one embodiment, the connectivity tests may indicate whether the card reader, verification application and computing device are functioning properly. The connectivity tests may also indicate errors or failures if present and a reason for the errors or failures if known. Once the conductivity tests are performed, the operator may select a next button to proceed with testing of the memory card.

Figure 8:
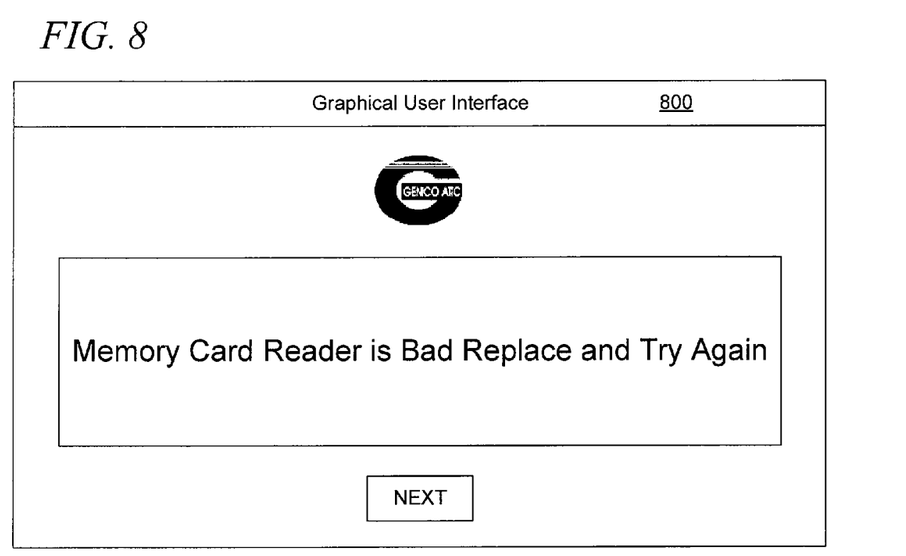

With reference to FIG. 8, a GUI 800 may indicate whether the memory card reader has failed, or experiencing errors. For example, the GUI 800 may be displayed in response to the card reader failing the conductivity test.

Figure 9:
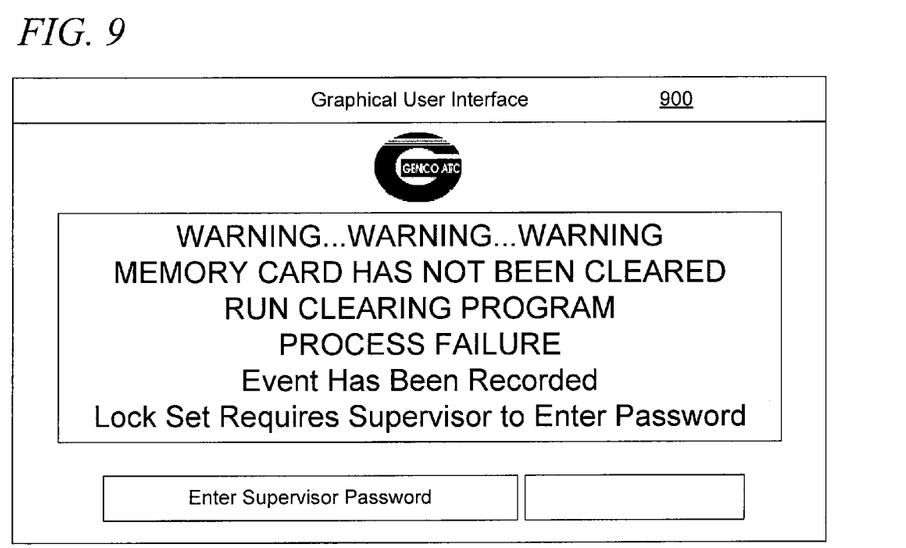

With reference to FIG. 9, a GUI 900 may indicate that the memory card has not been cleared. For example, the memory card may not have been run through a batch clearing process during which the memory of the memory card was cleared, the volume name was rewritten, and the master image was written to the memory card. As a result, the operator may know to have the memory card run through the clearing process and/or program. The GUI 900 may require a supervisor password be entered to unlock the verification application and to move beyond the screen displayed by the GUI 900.

Figure 10:
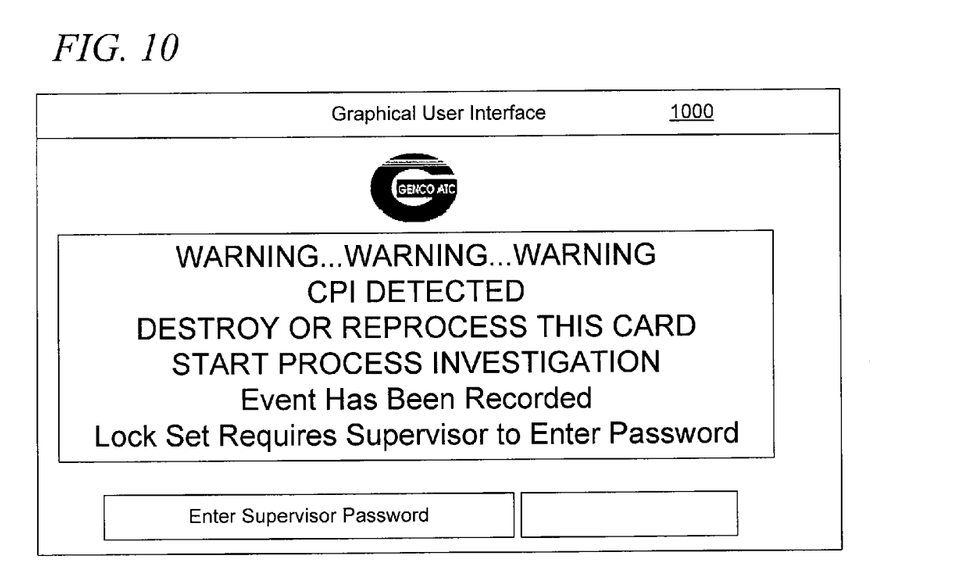

With reference to FIG. 10, a GUI 1000 may indicate that CPI has been detected on the memory card. In one embodiment, the GUI 1000 may instruct the operator to destroy the memory card. In another embodiment, the GUI 1000 may instruct the operator to run the memory card through the clearing process again and report the CPI to an administrator or supervisor either directly or through electronic correspondence. The GUI 1000 may also require that a supervisor password be entered to unlock the GUI 1000 and the processes of the verification application.

Figure 11:
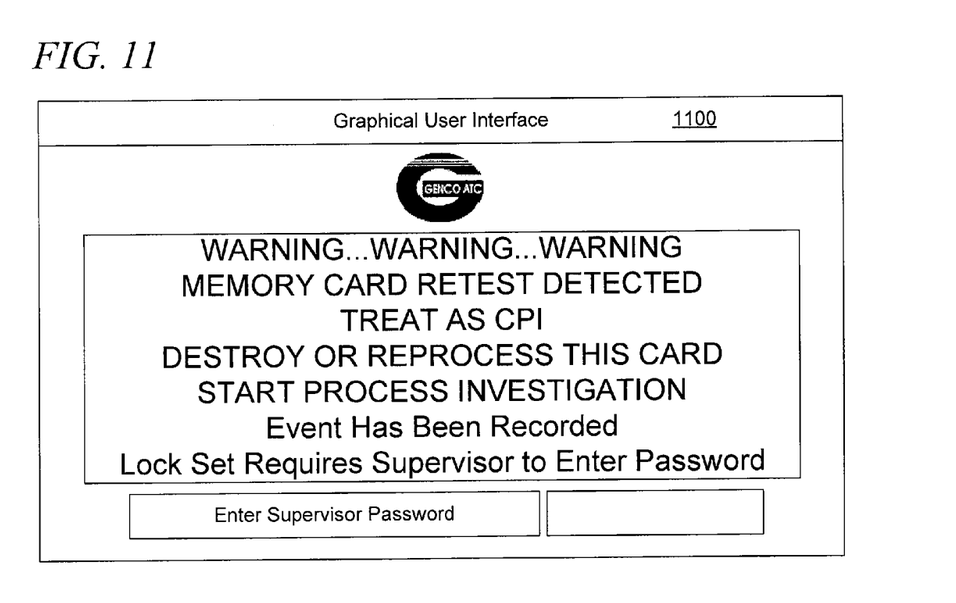

With reference to FIG. 11, a GUI 1100 may indicate to the operator that the memory card was previously tested. In one embodiment, the GUI 1100 may be displayed to the operator in response to the memory card being run through the verification process (by being connected to the card reader) a second time. The memory card may be destroyed or reprocessed according to internal processes and policies established for such an occurrence. Similarly, a supervisor password may be required to move beyond the GUI 1100.

Another embodiment provides a system, method, and devices for auditing one or more memory cards that may or may not have been previously processed. Memory cards are frequently shipped between different locations, facilities, and so forth. In each separate location, each of the memory cards may be utilized, processed, or tracked differently. The illustrative embodiments allow a user/operator to determine the status of each memory card to determine whether internal processes, systems, equipment, and users are meeting the obligations, requirements, standards, laws, and protocols required by the applicable organization or party.

For example, a first facility may utilize a first system to clear the memory cards and prepare them for subsequent utilization while a second facility utilizing a second system may utilize the memory cards within wireless devices to determine the functional capabilities of the wireless devices. The memory cards may then be subsequently shipped to a different location to be utilized for a different purpose. As a result, the status of each of the memory cards may need to be verified to prevent nonfunctional, corrupt, unformatted, or other unacceptable memory cards from being reused or distributed. The different facilities or groups may represent processing, testing, and quality assurance groups that may utilize the memory cards.

Figure 12:
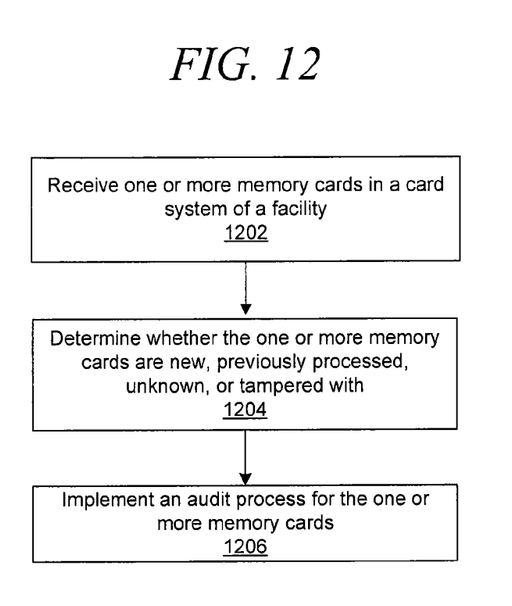
FIG. 12 is a flowchart of a process for determining a status of one or more memory cards in accordance with an illustrative embodiment.

FIG. 12 is a flowchart of a process for determining a status of one or more memory cards in accordance with an illustrative embodiment. The process of FIG. 12 may be implemented alone or as an integrated portion of FIG. 13. In one embodiment, the process of FIG. 12 may begin by receiving one or more memory cards in a card system of a facility (step 1202). The card system may be configured to determine the status of one or more memory cards concurrently, sequentially, or simultaneously. For example, a user may insert the one or more memory cards and two slots or receptacles for performing the process of FIG. 12.

Next, the card system determines whether the one or more memory cards are new, previously processed, unknown, or tampered with (step 1204). As previously described, the card system may utilize a volume name and designated hidden folder to determine whether the one or more memory cards have previously been processed. The presence or name of the volume name and hidden folder may be utilized to determine the status of the one or more memory cards. For example, if a memory card does not include a hidden folder, the memory card may be categorized as new. In another example, if the memory card includes a volume name associated with a different facility, the memory card may be associated with a status indicating previously processed. The name and other information associated with the hidden folder may also indicate whether the one or more memory cards have been previously processed or handled by another group. In another example, the memory card may not include a volume name or hidden folder indicating that the memory card has not been previously processed. If the memory card includes the correct volume name, folders, and files, but includes CPI, the memory card may be determined to have been tampered with since the time the memory card previously passed a given process.

Status and other relevant information may be displayed to the user utilizing the card system. For example, a graphical user interface may indicate the status and instructions for performing additional steps to properly process the memory cards.

Next the card system implements and audit process for the one or more memory cards (step 1206). The audit process may include taking one or more steps to determine the status of the one or more memory cards, rename the hidden file, update associated information, and clear the memory card of any unwanted data, files, or information.

Figure 13:
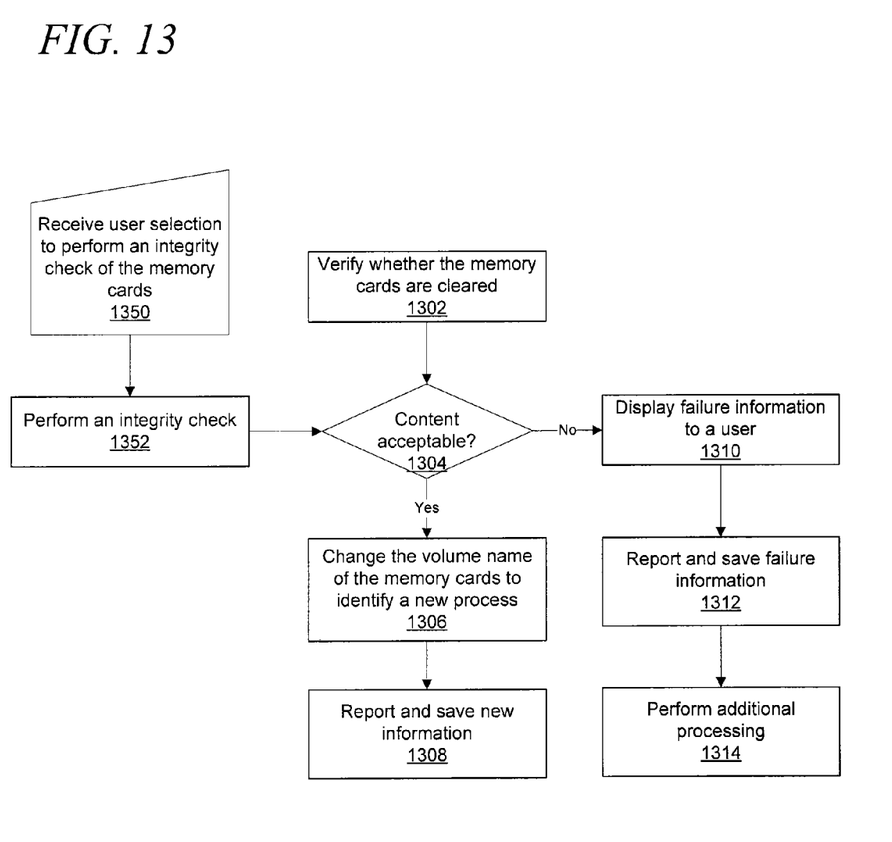
FIG. 13 is a flowchart of a process for auditing one or more memory cards in accordance with illustrative embodiment.

FIG. 13 is a flowchart of a process for auditing one or more memory cards in accordance with illustrative embodiment. The process of FIG. 13 may include any of the steps or processes of FIG. 5. The process of FIG. 13 may be performed to audit one or more memory cards that may be returning or coming into a facility. For example, the one or more memory cards may be received for redistribution alone or with any number of electronic devices. The content and the processing of the one or more memory cards is verified before the one or more memory cards can be sent out.

The process may begin by verifying whether the memory cards are cleared (1302). In one embodiment, all or portions of the process described in FIG. 5 may be performed for each of the memory cards.

Next, the card system determines whether the content of the memories cards is acceptable (step 1304). During step 1304, the card system may look at the volume name, hidden files, and any other files, data, or information that may be stored on the memory cards. The results of the determination may be displayed to the user. For example, as previously described, a green screen or indicator may indicate the content is acceptable, yellow screen or indicator may include a technical or user error, and a red screen or indicator may indicate that the content of the memory card is unacceptable or corrupted. Errors that results from user error may be repeated a number of times so that the user may remedy the error without reporting the incident to a supervisor or other party.

In one embodiment, the card system determines the content is acceptable if the volume name is a name previously assigned by the card system and the files include hidden files loaded by the card system to identify the memory (e.g. including a serial number identifying each of the memory cards).

If the content is determined to be acceptable during step 1306, the card system changes the volume name of the memory cards to identify a new process (step 1304). The volume name may be utilized to associate each of the memory cards with a particular facility, clearing process, communications service provider, or so forth. As a result, any user or party that subsequently access the memory card may determine where each memory card has been or at what stage in a process the memory card is in for taking additional actions. For example, a group or facility that tests new memory cards may use a first volume label, and an analysis group may use a second label, and a quality assurance group may utilize a third label for identifying where each memory card has come from. In one embodiment, a legal agreement or industry standard may establish the utilized volume name for tracking potential processing failures for correcting issues. For example, the name of the volume may be changed from PASS to IQA-PASS.

In another embodiment, the hidden file saved to the memory card may also be updated.

Next, the card system reports and saves the new information (step 1308). In one embodiment, a database may be updated to associate the new volume name with the serial number of the memory card. The database may also store the current location of the memory card and intended destination for tracking each of the memory cards to determine compliance with internal processes, business practices, industry standards, auditing standards, applicable laws, or so forth.

If the content is determined to not be acceptable during step 1306, the card system displays failure information to a user (step 1310). In one embodiment, the failure information is a red screen that may flash an applicable information, such as "CPI Detected", "Incorrect Volume Name", or "No Hidden File."

Next, the card system reports and saves failure information (step 1312). In one embodiment, the card system may associated a status or failure reason with the memory card for subsequent processing and to determine why the memory card has failed. The card system may also push detected files or information to a specified database or server path for additional information.

Next, the card system performs additional processing (step 1314). Additional processing may include physically labeling the memory card utilizing an automated or manual process. The memory card may also be cleared of applicable data, volume name renamed, and hidden files added with an electronic serial number of the memory card. In other embodiments, a memory card that does not pass the various steps may be deemed a failure or corrupt and manually or automatically destroyed with a record being kept or updated for tracking and audit purposes. In addition, failures may be reported utilizing automated messaging, displays, or alerts to a supervisor, remote, party or other designated individual for remedying the potential issue or problem with the system, devices, users, or processes.

At any time the card system may receive a user selection to perform an integrity check of the memory cards (step 1350). In one embodiment, the user selection may be a manual selection received through a graphical user interface. The user selection may be received at any time.

Next, the card system performs the integrity check (step 1350). During the integrity check, the system determines if any of the unacceptable states exist and if so determines whether the memory card includes the required hidden files, folders, volume names and other information to be defined as a "cleared process." During the integrity check, the card system may verify that no unauthorized. In one embodiment, the additional processing of step 1314 may include performing the integrity check. The memory cards may be additionally processed after the integrity check. For example, the card system may continue the process by determining the content is acceptable (step 1306). The content may be the results of the integrity check and may determine whether the volume name is correct, the designated or selected hidden file and assigned electronic identifier are present, and there is no CPI or unwanted files, data, or information stored on the memory card.

The previous detailed description is of a small number of embodiments for implementing the invention and is not intended to be limiting in scope. The following claims set forth a number of the embodiments of the invention disclosed with greater particularity.

What is claimed:

1. A method for auditing memory cards, the method comprising:
   receiving a memory card in a card reader in communication with a computing device;
   scanning the memory card utilizing a computing device;
   determining whether content in the memory card is acceptable or unacceptable; and
   rewriting a first volume name of the memory card to a second volume name in response to determining the content in the memory card is acceptable.

2. The method according to claim 1, further comprising:
   displaying a visual indicators indicating whether the content in the memory card is acceptable.

3. The method according to claim 1, wherein the determining whether content in the memory card is acceptable or unacceptable comprises:
   determining whether a volume name of the memory card is the first volume name; and
   determining whether the memory card includes a designated hidden file.

4. The method according to claim 1, wherein the first volume name is associated with a first facility or a first process and the second volume name is associated with a second facility or a second process.

5. The method according to claim 1, further comprising:
   determining a status of the memory card in response to the scan, wherein the status includes at least one of new, previously processed, or unknown.

6. The method according to claim 1, further comprising:
   generating an electronic record associated with the memory card including at least an identifier associated with the memory card.

7. The method according to claim 6, wherein the identifier is a virtual serial number stored in a hidden file of the memory card.

8. The method according to claim 6, further comprising:
   storing the electronic record in a database accessible by parties with permissions, wherein the electronic record indicates whether the content is acceptable or unacceptable.

9. The method according to claim 1, further comprising:
   displaying failure information to a user in response to determining the content is unacceptable.

10. The method according to claim 1, wherein the method is performed for a plurality of memory cards simultaneously.

11. A system for auditing one or more memory cards, the system comprising:
   a computing device configured to display instructions for auditing the one or more memory cards and electronic records for each of the one or more memory cards; and
   a card reader in communication with the computing device, the card reader is configured to receive one or more memory cards, wherein the computing device is configured to automatically scan the one or more memory cards utilizing the card reader, determine whether content on the one or more memory cards is acceptable or unacceptable, and rewrite a volume name from a first volume name of the one or more memory cards to a second volume name in response to determining the content on the one or more memory cards is acceptable.

12. The system according to claim 11, wherein the computing device is further configured to display visual indicators indicating whether the card reader is functioning correctly and whether the content on each of the one or more memory cards is acceptable or unacceptable.

13. The system according to claim 11, wherein the computing device determines whether the content on the one or more memory cards is acceptable or unacceptable by:
   determining whether a volume name of the one or more memory cards is a first volume name; and
   determining whether the one or more memory cards include a designated hidden file.

14. The system according to claim 11, wherein the computing device:
   generates the electronic record associated with the one or more memory cards including at least a virtual serial number associated with the memory card and whether the content is acceptable or unacceptable.

15. The system according to claim 11, wherein electronic record includes a virtual serial number associated with each of the one or more memory cards, wherein the virtual serial number is stored in a hidden file of each of the one or more memory cards, and wherein the virtual serial numbers identify the system.

16. The system according to claim 11, further comprising:
   a database in communication with the computing device configured to store electronic records associated with each of the one or more memory cards.

17. The system according to claim 12, wherein the visual indicators includes at least a green screen indicating the one or more memory cards includes acceptable content, a yellow screen indicating there was an error, and a red screen indicating that the one or more memory cards includes unacceptable content, and wherein an administrator password is required to be received by the computing device in response to the one or more memory cards including content that is unacceptable.

18. A computing device for verifying content of one or more memory cards, comprising:
   a processor for executing a set of instructions;
   a memory for storing the set of instructions; and
   a card reader for communicating with the one or more memory cards, wherein the set of instructions are executed to:

scan the one or memory cards utilizing a computing device;
determine whether content on the one or more memory cards is acceptable; and
rewrite a first volume name to a second volume name in response to determining the content in the one or more memory cards is acceptable.

19. The computing device according to claim 18, displaying visual indicators indicating whether the card reader is functioning correctly and whether the content on each of the one or more memory cards is acceptable or unacceptable.

20. The computing device according to claim 18, wherein the content is determined to be acceptable in response to determining a volume name and hidden file are acceptable.

21. The computing device according to claim 18, wherein the first volume name is associated with a first facility or a first process and the second volume name is associated with a second facility or a second process.

* * * * *